US012802724B2

(12) United States Patent
Liu et al.

(10) Patent No.: US 12,802,724 B2
(45) Date of Patent: Nov. 17, 2026

(54) MEMORY READ-WRITE VERIFICATION METHOD

(71) Applicant: Xiamen Industrial Technology Research Institute Co., Ltd., Xiamen (CN)

(72) Inventors: Meidong Liu, Xiamen (CN); Juilung Chen, Xiamen (CN); Tianhui Huang, Xiamen (CN); Jiayu Yin, Xiamen (CN)

(73) Assignee: Xiamen Industrial Technology Research Institute Co., Ltd., Xiamen City (CN)

( * ) Notice: Subject to any disclaimer, the term of this patent is extended or adjusted under 35 U.S.C. 154(b) by 97 days.

(21) Appl. No.: 18/966,075

(22) Filed: Dec. 2, 2024

(65) Prior Publication Data

US 2025/0095701 A1 Mar. 20, 2025

Related U.S. Application Data

(63) Continuation of application No. PCT/CN2023/100678, filed on Jun. 16, 2023.

(30) Foreign Application Priority Data

Sep. 14, 2022 (CN) .......................... 202211116973.2

(51) Int. Cl.

| | |
|---|---|
| ***G11C 16/06*** | (2006.01) |
| ***G11C 7/10*** | (2006.01) |
| *G11C 16/34* | (2006.01) |

(52) U.S. Cl.
CPC .......... *G11C 7/1051* (2013.01); *G11C 7/1096* (2013.01); *G11C 16/06* (2013.01); *G11C 16/344* (2013.01)

(58) Field of Classification Search
CPC ...................................................... G11C 16/06
See application file for complete search history.

(56) References Cited

U.S. PATENT DOCUMENTS

2014/0098615 A1 * 4/2014 Mu ..................... G11C 16/344
365/185.22

FOREIGN PATENT DOCUMENTS

| | | | |
|---|---|---|---|
| CN | 102810335 | A | 12/2012 |
| CN | 103065682 | A | 4/2013 |
| CN | 115472190 | A | 12/2022 |
| JP | 2017059278 | A | 3/2017 |
| JP | 2017182850 | A | 10/2017 |

* cited by examiner

*Primary Examiner* — Jason Lappas

(57) ABSTRACT

Disclosed is a memory read-write verification method. Firstly, margin verify is carried out on all input/output (IO) of the memory according to input data, readout data corresponding to each piece of the IO is acquired according to a verify result, and whether to execute a write operation on the IO corresponding to the readout data is determined according to the readout data. Then, the write operation is executed on IO on which the write operation is required to be executed. Finally, the margin verify is carried out again after the write operation is completed, and whether write-in of corresponding IO succeeds is determined according to a verify result. Thus, rewrite-in can be avoided, and verify efficiency can be improved.

18 Claims, 7 Drawing Sheets

Prior Art

Prior Art

Prior Art

MEMORY READ-WRITE VERIFICATION METHOD

CROSS-REFERENCE TO RELATED APPLICATIONS

This application is a continuation of International Patent Application No. PCT/CN2023/100678, filed on Jun. 16, 2023, which claims the benefit of priority from Chinese Patent Application No. 202211116973.2, filed on Sep. 14, 2022. The content of the aforementioned applications, including any intervening amendments thereto, are incorporated herein by reference.

TECHNICAL FIELD

The disclosure relates to the technical field of electronics, and particularly relates to a memory read-write verification method, and a computer-readable storage medium.

BACKGROUND

In the related art, every time data is written into a memory, it is required to verify whether a true value written into the memory is equal to an input value, and read whether an electric current satisfies a margin. That is, verify is required each time after write is performed. When an existing read-write verify method is used, an entire system is required to perform Margin 0 verify or Margin 1 verify. Moreover, rewrite-in is required if write-in fails. That is, rewrite is required no matter whether original write-in succeeds. As a result, system consumption is increased, and over write is likely to occur.

SUMMARY

The disclosure aims to solve at least one of the technical problems in the above technology to some extent. Thus, a first objective of the disclosure is to provide a memory read-write verification method. Rewrite-in can be avoided, and verify efficiency can be improved.

A second objective of the disclosure is to provide a computer-readable storage medium.

In order to achieve the above objectives, an example of a first aspect of the disclosure provides a read-write verify method for memory. The method includes steps as follows: carrying out margin verify on all input/output (IO) of the memory according to input data, acquiring readout data corresponding to each piece of the IO according to a verify result, and determining whether to execute a write operation on the IO corresponding to the readout data according to the readout data; executing the write operation on IO on which the write operation is required to be executed; and carrying out the margin verify again after the write operation is completed, and determining, according to a verify result, whether write-in of corresponding IO succeeds.

According to the memory read-write verification method provided in an example of the disclosure, firstly, margin verify is carried out on all pieces of IO of the memory according to input data, readout data corresponding to each piece of the IO is acquired according to a verify result, and whether to execute a write operation on the IO corresponding to the readout data is determined according to the readout data. Then, the write operation is executed on IO on which the write operation is required to be executed. Finally, the margin verify is carried out again after the write operation is completed, and whether write-in of corresponding IO succeeds is determined according to a verify result. Thus, rewrite-in can be avoided, and verify efficiency can be improved.

In addition, the above memory read-write verification method provided in an example of the disclosure may further have the following additional technical features.

Optionally, the carrying out margin verify on all pieces of IO of the memory according to input data includes: carrying out, in a case that the input data is 0, Margin 0 verify on IO corresponding to the input data of 0, and carrying out, in a case that the input data is 1, Margin 1 verify on IO corresponding to the input data of 1.

According to the above technical means, Margin 0 verify or Margin 1 verify can be carried out on all the IO according to corresponding input data. Thus, system consumption can be reduced, and verify efficiency can be further improved.

Optionally, the carrying out Margin 0 verify on IO corresponding to the input data of 0 includes: comparing an electric current of the IO corresponding to the input data of 0 with Margin 0, where Margin 0 denotes a margin required to be satisfied for write 0.

Optionally, the carrying out Margin 1 verify on IO corresponding to the input data of 1 includes: comparing an electric current of the IO corresponding to the input data of 1 with Margin 1, where Margin 1 denotes a margin required to be satisfied for write 1.

Optionally, the acquiring readout data corresponding to each piece of the IO according to a verify result includes: acquiring, in a case that the electric current of the IO corresponding to the input data of 0 is less than Margin 0, corresponding readout data of 0; and otherwise, acquiring corresponding readout data of 1.

Optionally, in a case that the electric current of the IO corresponding to the input data of 1 is greater than Margin 1, corresponding readout data of 1 is acquired; and otherwise, corresponding readout data of 0 is acquired.

Optionally, the determining whether to execute a write operation on the IO corresponding to the readout data according to the readout data includes: determining whether the readout data is equal to corresponding input data, if yes, executing no write operation on the IO corresponding to the readout data, and if no, executing the write operation on the IO corresponding to the readout data.

Optionally, the determining whether write-in of corresponding IO succeeds according to a verify result includes: determining, when the corresponding readout data is 0 in a case that the electric current of the IO corresponding to the input data of 0 is less than Margin 0, that the write-in succeeds; and otherwise, determining that the write-in fails; and determining, when the corresponding readout data is 1 in a case that the electric current of the IO corresponding to the input data of 1 is greater than Margin 1, that the write-in succeeds; and otherwise, determining that the write-in fails.

Optionally, in response to determining that the write-in of the corresponding IO fails according to the verify result, the write operation is continuously executed on the IO on which the write operation is required to be executed, and iteration is repeated until it is determined that write-in of all the IO succeeds.

In order to achieve the above objectives, an example of a second aspect of the disclosure provides a computer-readable storage medium. A memory read-write verification program is stored in the computer-readable storage medium. When the memory read-write verification program is executed by a processor, the above memory read-write verification method is implemented.

According to the computer-readable storage medium in an example of the disclosure, by storing the memory read-write verification program, when the memory read-write verification program is executed by the processor, the memory read-write verification method as mentioned above can be implemented. Thus, rewrite-in can be avoided, and verify efficiency can be improved.

BRIEF DESCRIPTION OF THE DRAWINGS

FIG. 2(*b*) is a schematic diagram of a write circuit corresponding to an existing memory read-write verification method;

FIG. 5(*b*) is a schematic diagram of a write circuit corresponding to a memory read-write verification method according to an example of the disclosure

DETAILED DESCRIPTION

Figure 1:
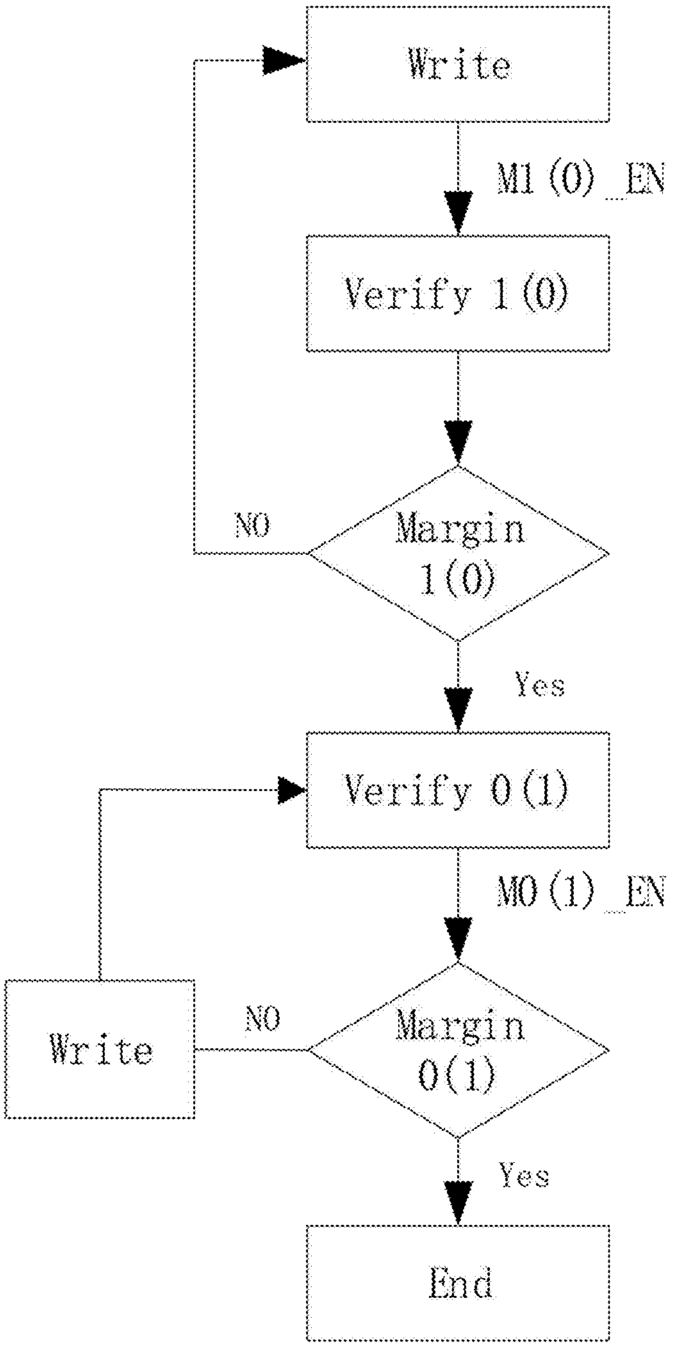
FIG. 1 is a schematic flow diagram of an existing memory read-write verification method.

Examples of the disclosure will be described in detail below. Instances of the examples are shown in accompanying drawings, throughout which identical or similar reference numerals denote identical or similar elements or elements having identical or similar functions. The following examples described with reference to the accompanying drawings are exemplary and merely used to explain the disclosure, but cannot be construed as limitations on the disclosure.

Figure 2A:
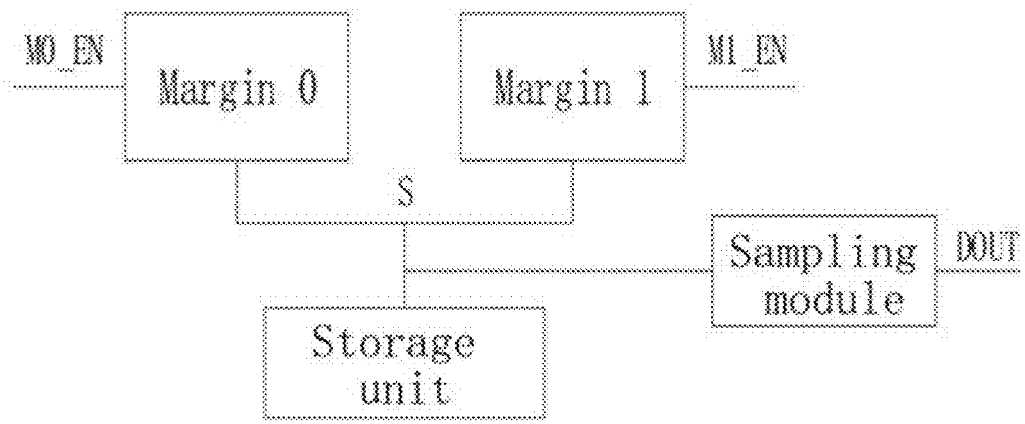
FIG. 2(*a*) shows a schematic diagram of a read circuit corresponding to an existing memory read-write verification method.
Figure 2B:
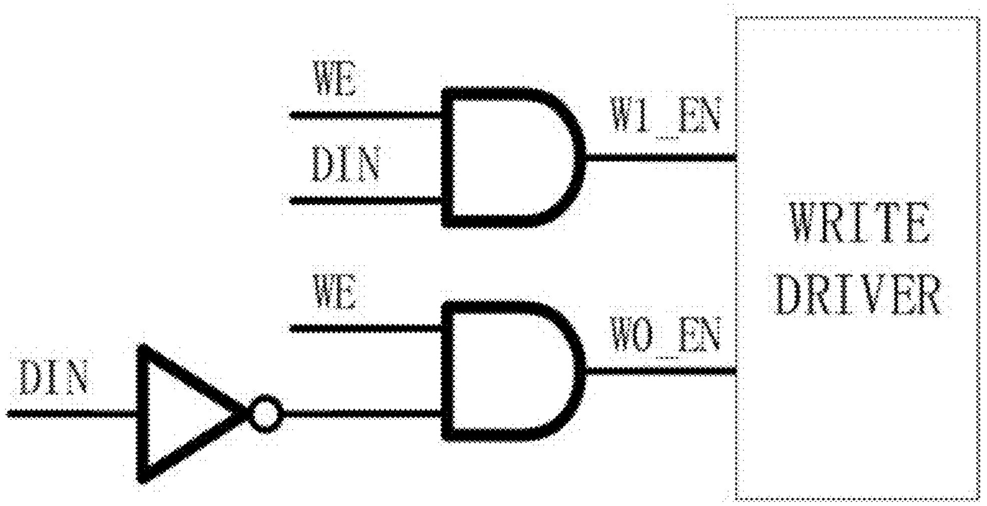

In the related art, as shown in FIG. 1, according to a schematic diagram of existing verify read, during Verify 0, M0_EN is enabled, M1_EN is disabled, and dataout (DOUT) reads out data. During Verify 1, M0_EN is disabled, M1_EN is enabled, and DOUT reads out data. According to a schematic diagram of write drive, a write operation is executed when WE is enabled. In a case of datain (DIN)=0, W1_EN is disabled, W0_EN is enabled, and a write 0 operation is executed. In a case of DIN=1, W1_EN is enabled, W0_EN is disabled, and a write 1 operation is executed. A corresponding flow diagram is shown in FIG. 2(*a*) and FIG. 2(*b*). Firstly, a first write operation is executed. Then, M1_EN is controlled to be enabled. A Verify 1 operation is executed on all input/output (IO), and Cell data of a specified address is read out. In a case that specified DOUT is different from IO of DIN=1, write 1 fails. Data is continuously written until a condition is satisfied. In a case that specified DOUT is the same as IO of DIN=1, write 1 succeeds. Finally, M0_EN is enabled, Verify 0 is executed on all the IO, and Cell data of a specified address is read out. In a case that specified DOUT is different from IO of DIN=0, write 0 fails. Data is continued to be written until a condition is satisfied. In a case that specified DOUT is the same as IO of DIN=0, write 0 succeeds. It can be seen therefrom that the following steps are required to be operated through an existing read-write verify method: Write→Verify1(0)→Verify0(1). Each time verify is carried out, verify is carried out on all the IO. That is, Verify 0 means that whether an address of write 0 is write 0 is verified by the entire system, and Verify 1 means that whether an address of write 1 is write 1 is verified by the entire system. Through such discrete operations, system consumption is significantly increased. Moreover, when write fails once, if write disturb is considered, at least one time of additional Verify is required to be added. The system consumption is also increased due to additional Verify. In addition, when write fails once, rewrite is required. However, such rewrite is also at a system level. That is, one time of rewrite is required no matter whether original write-in succeeds. Through such an operation, over write may occur.

In order to solve the above problems, the disclosure provides a memory read-write verification method, which can implement an operation step as follows: Write→Verify. In the Verify process, Verify 0 and Verify 1 are carried out simultaneously. Whether Verify 0 or Verify 1 is carried out is determined according to input data. Through the simultaneous Verify structure, system consumption can be reduced, and Verify efficiency can be increased. Further, write is not carried out on Cell of which write-in succeeds, and on only Cell not passing Verify. Each time a write operation is completed, Verify is carried out on a current address. A specific Verify operation is implemented according to DIN. Thus, according to the disclosure, over write cannot occur, and no Verify will be additionally added.

In order to better understand the above technical solutions, examples of the disclosure will be described in more detail below with reference to the accompanying drawings. Although the examples of the disclosure are shown in the accompanying drawings, it should be understood that the disclosure can be implemented in various forms and should not be limited by the examples set forth herein. On the contrary, these examples are provided such that the disclosure can be understood more thoroughly and completely, and the scope of the disclosure can be fully conveyed to those skilled in the art.

In order to better understand the above technical solution, the above technical solutions will be described in detail below in combination with the accompanying drawings of the description and particular embodiments.

A memory read-write verification method according to an example of the disclosure will be described below with reference to accompanying drawings.

Figure 3:
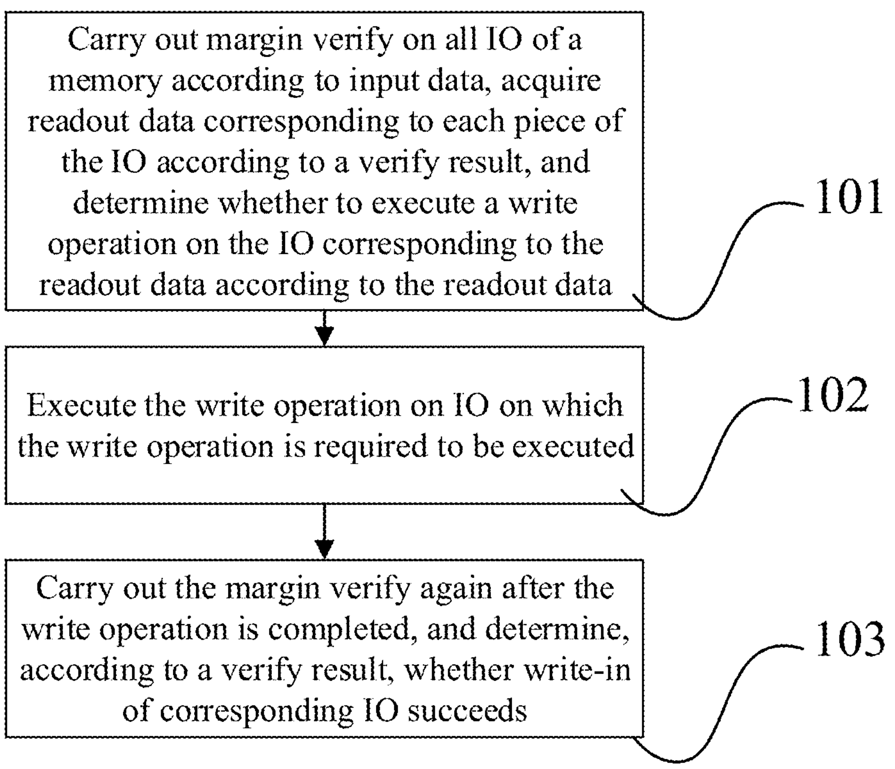
FIG. 3 is a schematic flow diagram of a memory read-write verification method according to an example of the disclosure.

Specifically, FIG. 3 is a schematic flow diagram of a memory read-write verification method according to an example of the disclosure. As shown in FIG. 3, the memory read-write verification method includes the following steps.

Step 101: margin verify is carried out on all IO of the memory according to input data, readout data corresponding to each piece of the IO is acquired according to a verify result, and whether to execute a write operation on the IO corresponding to the readout data is determined according to the readout data.

That is, margin verify is carried out before a write operation such that rewrite-in of original IO of which write-in succeeds can be avoided.

It should be noted that whether write-in of corresponding IO succeeds can be determined according to the verify result manually or by means of a specific device, which is not specifically limited in the disclosure.

As an example, the step that margin verify is carried out on all the IO of the memory according to input data includes: in a case that the input data is 0, Margin 0 verify is carried out on IO corresponding to the input data of 0. In a case that the input data is 1, Margin 1 verify is carried out on IO corresponding to the input data of 1.

In other words, during verify, Margin 0 verify or Margin 1 verify can be carried out on the IO according to input data. That is, Margin 0 verify or Margin 1 verify is carried out on the IO according to actual requirements. Thus, verify is carried out on all the IO once simultaneously.

As an example, the step that Margin 0 verify is carried out on IO corresponding to the input data of 0 includes: an electric current of the IO corresponding to the input data of 0 is compared with Margin 0, where Margin 0 denotes a margin required to be satisfied for write 0.

As an example, the step that readout data corresponding to each piece of the IO is acquired according to a verify result includes: in a case that the electric current of the IO corresponding to the input data of 0 is less than Margin 0, corresponding readout data of 0 is acquired; and otherwise, the corresponding readout data of 1 is acquired.

That is, if the readout data corresponding to the input data of 0 is 0, it is indicated that write-in succeeds. If the readout data corresponding to the input data of 0 is 1, it is indicated that write-in fails.

As an example, the step that Margin 1 verify is carried out on IO corresponding to the input data of 1 includes: an electric current of the IO corresponding to the input data of 1 is compared with Margin 1, where Margin 1 denotes a margin required to be satisfied for write 1.

As an example, the step that readout data corresponding to each piece of the IO is acquired according to a verify result further includes:

in a case that the electric current of the IO corresponding to the input data of 1 is greater than Margin 1, corresponding readout data of 1 is acquired; and otherwise, corresponding readout data of 0 is acquired.

That is, if the readout data corresponding to the input data of 1 is 1, it is indicated that write-in succeeds. If the readout data corresponding to the input data of 1 is 0, it is indicated that write-in fails.

As an example, the step that whether to execute a write operation on the IO corresponding to the readout data is determined according to the readout data includes: whether the readout data is equal to corresponding input data is determined. If yes, no write operation is executed on the IO corresponding to the readout data. If no, the write operation is executed on the IO corresponding to the readout data.

It should be noted that if the readout data is equal to the corresponding input data, it is indicated that the write-in succeeds. Thus, no write operation is required to be executed on the corresponding IO again. In this case, the write operation is required to be re-executed only on IO of which write-in fails.

Step 102: the write operation is executed on IO on which the write operation is required to be executed.

It should be noted that the IO on which the write operation is required to be executed refers to IO of which write-in fails.

Step 103: the margin verify is carried out again after the write operation is completed, and whether write-in of corresponding IO succeeds is determined according to a verify result.

It should be noted that the step that whether write-in of corresponding IO succeeds is determined according to a verify result includes: when the corresponding readout data is 0 in a case that the electric current of the IO corresponding to the input data of 0 is less than Margin 0, it is determined that the write-in succeeds; and otherwise, it is determined that the write-in fails. When the corresponding readout data is 1 in a case that the electric current of the IO corresponding to the input data of 1 is greater than Margin 1, it is determined that the write-in succeeds; and otherwise, it is determined that the write-in fails.

Figure 4:
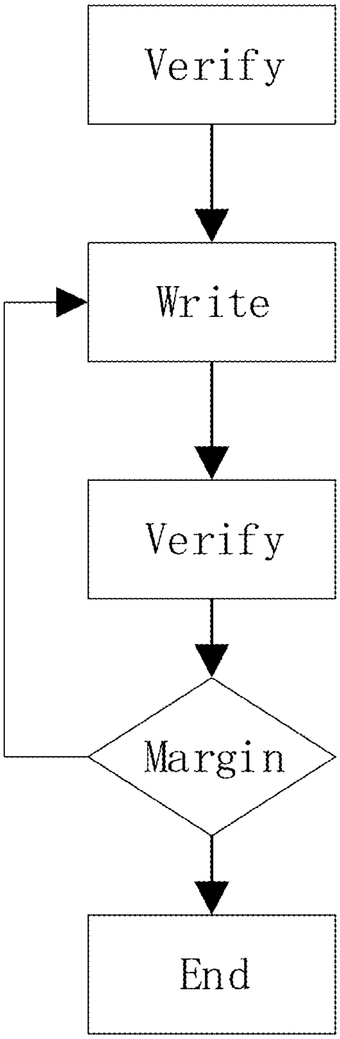
FIG. 4 is a schematic flow diagram of a memory read-write verification method according to an example of the disclosure.

As an example, as shown in FIG. 4, in response to determining that the write-in of the corresponding IO fails according to the verify result, the write operation is continuously executed on the IO on which the write operation is required to be executed. Iteration is repeated until it is determined that write-in of all the IO succeeds.

That is, step 1: Verify is carried out once, and DOUT of each piece of the IO at a specified address is read out. Step 2: in a case of DIN=DOUT, no write operation is executed on the IO; and otherwise the write operation is executed on the IO. Step 3: Verify is carried out again, and in cases that IO of write 0 satisfies Margin 0, and IO of write 1 satisfies Margin 1, write of all the IO succeeds; and otherwise, step 2 is proceeded again, and the write operation is executed on IO of which write fails.

That is, through Verify in step 1 of this process, no write operation is carried out on the IO in a case of DIN=DOUT. Thus, over write can be avoided, and system consumption can be reduced. Each time Verify is carried out, a corresponding Verify 0 or Verify 1 operation is carried out on the IO according to DIN simultaneously. Thus, system write and Verify processes are simplified.

Figure 5A:
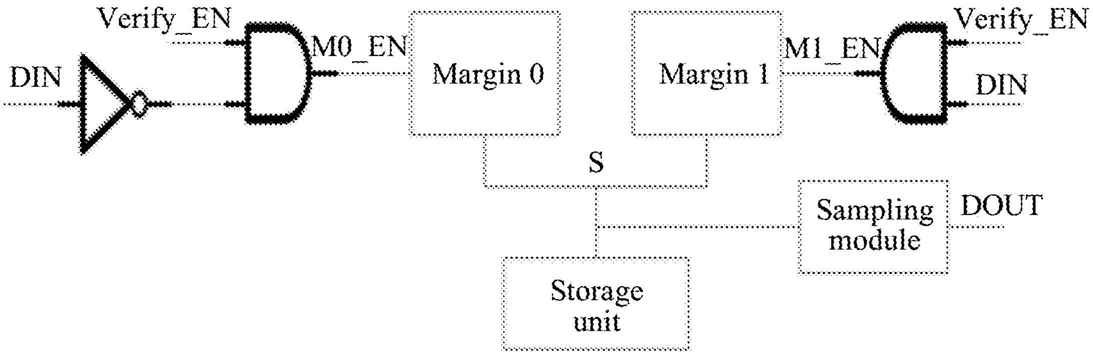
FIG. 5(*a*) shows a schematic diagram of a read circuit corresponding to a memory read-write verification method according to an example of the disclosure.
Figure 5B:
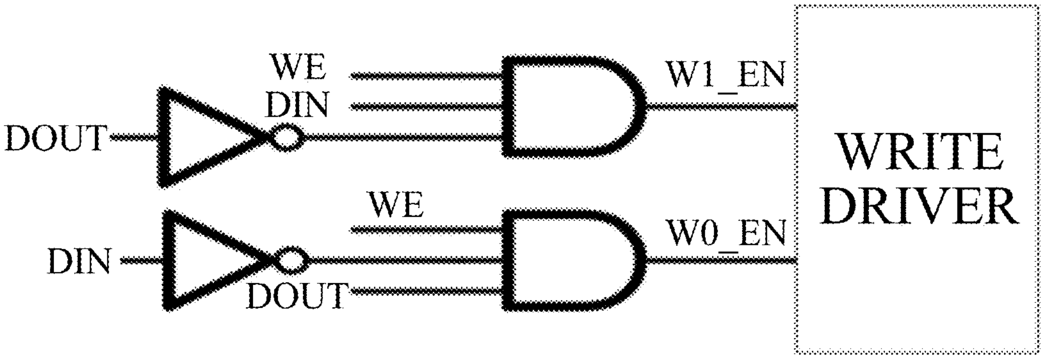

As a particular example, FIG. 5 shows schematic diagrams of a read circuit and a write circuit corresponding to a memory read-write verification method according to an example of the disclosure. As shown in FIG. 5(*a*), the Verify structure includes a first NOT gate, a first AND gate, a first verify unit, a second verify unit and a second AND gate.

The first NOT gate is used to carry out a NOT operation on input data DIN.

Input data after the NOT operation is received by a first input terminal of the first AND gate. Verify enable signal Verify_EN is received by a second input terminal of the first AND gate. An output terminal of the first AND gate is connected to first verify unit Margin 0 such that write 0 verify enable signal M0_EN can be sent to first verify unit Margin 0.

Input data DIN is received by a first input terminal of the second AND gate. Verify enable signal Verify_EN is received by a second input terminal of the second AND gate. An output terminal of the second AND gate is connected to second verify unit Margin 1 such that write 1 verify enable signal M1_EN can be sent to second verify unit Margin 1.

First verify unit Margin 0 is connected to second verify unit Margin 1 such that margin verify can be carried out on all the IO of the memory according to input data DIN, and readout data DOUT corresponding to each piece of the IO can be acquired according to a verify result.

It should be noted that the Verify structure further includes a storage unit and a sampling module. The storage unit is used to store data. The sampling unit is used to sample readout data DOUT.

That is, through the above structure, when verify is required, Verify_EN is enabled. In a case of DIN=0, Margin 0 verify is carried out. In a case of DIN=1, Margin 1 verify is carried out. Thus, Margin 0 verify or Margin 1 verify can be carried out on each piece of the IO according to DIN. That is, verify can be carried out on all the IO simultaneously, and Verify 0 and Verify 1 can be carried out on the entire system simultaneously. Thus, system consumption can be reduced, and Verify efficiency can be increased.

As shown in FIG. 5(*b*), a write driving structure includes a second NOT gate, a third AND gate, a third NOT gate, a fourth AND gate and a write driver.

The second NOT gate is used to carry out a NOT operation on readout data DOUT.

Write enable signal WE is received by a first input terminal of the third AND gate. Input data DIN is received by a second input terminal of the third AND gate. Readout data after the NOT operation is received by a third input terminal of the third AND gate. An output terminal of the third AND gate is connected to the write driver such that write 1 enable signal W1_EN can be sent to the write driver, and write 1 is carried out according to the write 1 enable signal.

The third NOT gate is used to carry out a NOT operation on input data DIN.

Write enable signal WE is received by a first input terminal of the fourth AND gate. Input data after the NOT operation is received by a second input terminal of the fourth AND gate. Readout data DOUT is received by a third input terminal of the fourth AND gate. An output terminal of the fourth AND gate is connected to the write driver such that write 0 enable signal W0_EN can be send to the write driver, and write 0 is carried out according to the write 0 enable signal.

That is, through the above structure, when the write operation is carried out, for instance, under the condition of DIN=1, no write operation is required in a case of DOUT=1, and a write 1 operation is carried out in a case of DOUT=0. Under the condition that DIN=0, a write 0 operation is carried out in a case of DOUT=1, and no write operation is required in a case of DOUT=0. According to the structure, when the input DIN is equal to DOUT of last Verify, no Write is carried out. Thus, over write can be avoided, and system consumption can be reduced.

In summary, according to the memory read-write verification method provided in an example of the disclosure, firstly, margin verify is carried out on all the IO of the memory according to input data, readout data corresponding to each piece of the IO is acquired according to a verify result, and whether to execute a write operation on the IO corresponding to the readout data is determined according to the readout data. Then, the write operation is executed on IO on which the write operation is required to be executed. Finally, the margin verify is carried out again after the write operation is completed, and whether write-in of corresponding IO succeeds is determined according to a verify result. Thus, rewrite-in can be avoided, and verify efficiency can be improved.

In addition, an example of the disclosure further provides a computer-readable storage medium. A memory read-write verification program is stored in the computer-readable storage medium. When the memory read-write verification program is executed by a processor, the above memory read-write verification method is implemented.

According to the computer-readable storage medium in an example of the disclosure, by storing the memory read-write verification program, when the memory read-write verification program is executed by the processor, the memory read-write verification method as mentioned above can be implemented. Thus, rewrite-in can be avoided, and verify efficiency can be improved.

In the description of the disclosure, it should be understood that the terms "central", "longitudinal", "transverse", "length", "width", "thickness", "upper", "lower", "front", "back", "left", "right", "vertical", "horizontal", "top", "bottom", "inner", "outer", "clockwise", "counterclockwise", etc. indicate azimuthal or positional relations based on those shown in the accompanying drawings. The terms are only used for ease of description of the disclosure and for simplicity of description, and are not intended to indicate or imply that the referenced apparatus or element must have a particular orientation and be constructed and operated in a particular orientation, and thus cannot be construed as limitations on the disclosure.

In addition, terms "first" and "second" are used for descriptive purposes only, and cannot be construed as indicating or implying relative importance or implicitly indicating the number of technical features indicated. Thus, a feature defined with "first" or "second" can explicitly or implicitly include one or more of the features. In descriptions of the disclosure, "a plurality of" means two or more, unless expressly specified otherwise.

In the disclosure, unless otherwise explicitly specified and defined, the terms "mounted", "connected to", "connection", "fixed to", etc. should be understood in a broad sense. For instance, they can denote a fixed connection, a detachable connection, or an integrated connection, denote a mechanical connection or an electrical connection, denote a direct connection, or an indirect connection via an intermediate medium, or denote communication of interiors of two elements or an interaction between two elements. The specific meanings of the above terms in the disclosure can be understood by those of ordinary skill in the art according to specific circumstances.

In the disclosure, unless otherwise explicitly specified and defined, a case that a first feature is "above" or "below" a second feature can include a case that the first feature makes contact with the second feature directly, or can include a case that the first feature makes contact with the second feature not directly but by means of another feature therebetween. Furthermore, a case that the first feature is "over", "above" and "on" the second feature can include a case that the first feature is exactly or not exactly above the second feature, or only means that a level of the first feature is higher than that of the second feature. A case that the first feature is "under", "below" and "underneath" the second feature includes a case that the first feature is exactly or not exactly below the second feature, or only means that a level of the first feature is lower than that of the second feature.

In the description, a description with reference to terms such as "an example", "some examples", "instance", "particular instance", or "some instances" means that a specific feature, structure, material or feature described in combination with the example or instance are included in at least one example or instance of the disclosure. In the description, the schematic expression of the above term is not necessarily directed to the same example or instance. Moreover, the specific feature, structure, material or feature described can be combined in a suitable manner in any one or more examples or instances. In addition, examples or instances described in the description of the disclosure can be combined by those skilled in the art.

Although examples of the disclosure are shown and described above, it can be understood that the above examples are exemplary and cannot be construed as limitations on the disclosure. Changes, modifications, substitutions and variations can be made to the above examples by those of ordinary skill in the art.

What is claimed is:

1. A memory read-write verification method, comprising:

carrying out margin verify on all input/output (IO) of the memory according to input data, acquiring readout data corresponding to each piece of the IO according to a verify result, and determining whether to execute a write operation on the IO corresponding to the readout data according to the readout data;

executing the write operation on IO on which the write operation is required to be executed; and carrying out the margin verify again after the write operation is completed, and determining, according to a verify result, whether write-in of corresponding IO succeeds.

2. The memory read-write verification method according to claim 1, wherein the carrying out margin verify on all IO of the memory according to input data comprises:

carrying out, in a case that the input data is 0, Margin 0 verify on IO corresponding to the input data of 0, and carrying out, in a case that the input data is 1, Margin 1 verify on IO corresponding to the input data of 1.

3. The memory read-write verification method according to claim 2, wherein the carrying out Margin 0 verify on IO corresponding to the input data of 0 comprises:

comparing an electric current of the IO corresponding to the input data of 0 with Margin 0, wherein Margin 0 denotes a margin required to be satisfied for write 0.

4. The memory read-write verification method according to claim 3, wherein the carrying out Margin 1 verify on IO corresponding to the input data of 1 comprises:

comparing an electric current of the IO corresponding to the input data of 1 with Margin 1, wherein Margin 1 denotes a margin required to be satisfied for write 1.

5. The memory read-write verification method according to claim 4, wherein the acquiring readout data corresponding to each piece of the IO according to a verify result comprises:

acquiring, in a case that the electric current of the IO corresponding to the input data of 0 is less than Margin 0, corresponding readout data of 0; and otherwise, acquiring corresponding readout data of 1.

6. The memory read-write verification method according to claim 5, wherein the acquiring readout data corresponding to each piece of the IO according to a verify result further comprises:

acquiring, in a case that the electric current of the IO corresponding to the input data of 1 is greater than Margin 1, corresponding readout data of 1; and otherwise, acquiring corresponding readout data of 0.

7. The memory read-write verification method according to claim 1, wherein the determining whether to execute a write operation on the IO corresponding to the readout data according to the readout data comprises:

determining whether the readout data is equal to corresponding input data, if yes, executing no write operation on the IO corresponding to the readout data, and if no, executing the write operation on the IO corresponding to the readout data.

8. The memory read-write verification method according to claim 6, wherein the determining whether write-in of corresponding IO succeeds according to a verify result comprises:

determining, when the corresponding readout data is 0 in a case that the electric current of the IO corresponding to the input data of 0 is less than Margin 0, that the write-in succeeds; and otherwise, determining that the write-in fails; and determining, when the corresponding readout data is 1 in a case that the electric current of the IO corresponding to the input data of 1 is greater than Margin 1, that the write-in succeeds; and otherwise, determining that the write-in fails.

9. The memory read-write verification method according to claim 1, wherein in response to determining that the write-in of the corresponding IO fails according to the verify result, the write operation is continuously executed on the IO on which the write operation is required to be executed, and iteration is repeated until it is determined that write-in of all the IO succeeds.

10. A computer-readable storage medium, storing a memory read-write verification program, wherein when the memory read-write verification program is executed by a processor, the memory read-write verification method according to claim 1 is implemented.

11. A computer-readable storage medium, storing a memory read-write verification program, wherein when the memory read-write verification program is executed by a processor, the memory read-write verification method according to claim 2 is implemented.

12. A computer-readable storage medium, storing a memory read-write verification program, wherein when the memory read-write verification program is executed by a processor, the memory read-write verification method according to claim 3 is implemented.

13. A computer-readable storage medium, storing a memory read-write verification program, wherein when the memory read-write verification program is executed by a processor, the memory read-write verification method according to claim 4 is implemented.

14. A computer-readable storage medium, storing a memory read-write verification program, wherein when the memory read-write verification program is executed by a processor, the memory read-write verification method according to claim 5 is implemented.

15. A computer-readable storage medium, storing a memory read-write verification program, wherein when the memory read-write verification program is executed by a processor, the memory read-write verification method according to claim 6 is implemented.

16. A computer-readable storage medium, storing a memory read-write verification program, wherein when the memory read-write verification program is executed by a processor, the memory read-write verification method according to claim 7 is implemented.

17. A computer-readable storage medium, storing a memory read-write verification program, wherein when the memory read-write verification program is executed by a processor, the memory read-write verification method according to claim 8 is implemented.

18. A computer-readable storage medium, storing a memory read-write verification program, wherein when the memory read-write verification program is executed by a processor, the memory read-write verification method according to claim 9 is implemented.

* * * * *